United States Patent
Chiu et al.

(10) Patent No.: US 8,254,127 B2
(45) Date of Patent: Aug. 28, 2012

(54) HEAT DISSIPATION MODULE AND ELECTRONIC DEVICE HAVING THE SAME

(75) Inventors: Chun-Teng Chiu, Taipei (TW); Shih-Ying Ho, Taipei (TW); Chen-Te Hsu, Taipei (TW); Ing-Jer Chiou, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 162 days.

(21) Appl. No.: 12/646,974

(22) Filed: Dec. 24, 2009

(65) Prior Publication Data

US 2010/0172089 A1     Jul. 8, 2010

(30) Foreign Application Priority Data

Jan. 8, 2009   (TW) ............................... 98100497 A (51) Int. Cl.
*H05K 7/20* (2006.01)
(52) U.S. Cl. ........ 361/710; 361/707; 361/709; 361/719; 165/80.3; 165/104.33; 165/121
(58) Field of Classification Search .......... 361/688–697, 361/704, 707, 709, 710, 717–722
See application file for complete search history.

(56) References Cited

U.S. PATENT DOCUMENTS

| | | | | |
|---|---|---|---|---|
| 7,203,065 | B1 * | 4/2007 | Sin Yan Too | 361/704 |
| 7,349,212 | B2 * | 3/2008 | Xia et al. | 361/697 |
| 7,447,028 | B2 * | 11/2008 | Lai et al. | 361/697 |
| 7,663,882 | B2 * | 2/2010 | Li et al. | 361/697 |
| 7,679,919 | B2 * | 3/2010 | Lee | 361/719 |
| 7,733,649 | B2 * | 6/2010 | Anderl et al. | 361/695 |
| 7,969,728 | B2 * | 6/2011 | Zheng et al. | 361/679.51 |
| 2002/0186534 | A1 | 12/2002 | Sakaiya et al. | |
| 2005/0248918 | A1 * | 11/2005 | Lin | 361/687 |
| 2007/0256813 | A1 * | 11/2007 | Ho | 165/80.3 |
| 2007/0261822 | A1 * | 11/2007 | Lin et al. | 165/104.33 |
| 2008/0041561 | A1 * | 2/2008 | Zhou et al. | 165/80.3 |
| 2009/0211729 | A1 * | 8/2009 | Wang et al. | 165/80.3 |

FOREIGN PATENT DOCUMENTS

| | | |
|---|---|---|
| CN | 2524273 | 12/2002 |
| CN | 2635955 | 8/2004 |
| CN | 101059713 | 10/2007 |
| CN | 101080156 | 11/2007 |
| CN | 201064081 | 5/2008 |
| TW | 521952 | 2/2003 |
| TW | M325722 | 1/2008 |
| TW | 200809474 | 2/2008 |

OTHER PUBLICATIONS

"Office Action of Taiwan Counterpart Application", issued on May 25, 2011, p. 1-12.

* cited by examiner

*Primary Examiner* — Courtney Smith
(74) *Attorney, Agent, or Firm* — Jianq Chyun IP Office (57) ABSTRACT

A heat dissipation module includes a heat sink, a wind-guiding element and a pivot. The wind-guiding element is disposed on the heat sink, and the pivot is connected between the heat sink and the wind-guiding element to allow the wind-guiding element to rotate relative to the heat sink via the pivot. The wind-guiding element can change a direction of airflow to provide an optimal heat dissipation effect. Additionally, an electronic device using the heat dissipation module is also provided. The heat dissipation module can provide superior heat dissipation effect to an electronic component on the electronic device and maintain a normal operation of the electronic component.

16 Claims, 6 Drawing Sheets

HEAT DISSIPATION MODULE AND ELECTRONIC DEVICE HAVING THE SAME

CROSS-REFERENCE TO RELATED APPLICATION

This application claims the priority benefit of Taiwan application serial no. 98100497, filed on Jan. 8, 2009. The entirety of the above-mentioned patent application is hereby incorporated by reference herein and made a part of specification.

BACKGROUND OF THE INVENTION

1. Field of the Invention

The invention relates to an electronic device, more particularly, to an electronic device having a heat dissipation module.

2. Description of the Related Art

Recent years, electronic technology, particularly the processing technology in an integral circuit (IC), develops very quickly, and thus functions of electronic components are greatly improved. Along with improvements of a processing speed and efficiency of an electronic component, heat generated by the electronic components in operating is also increased. If waste heat cannot be taken away effectively, the electronic components may fail or be unable to reach optimal efficiency.

In a main body of a computer, to radiate heat of the electronic components disposed at a electronic device, a heat sink is usually disposed on the electronic component which easily generates high heat, and it cooperates with the airflow provided by a system fan in the main body or an additionally fan to take the heat generated by the electronic components in operating.

However, in a conventional main body of the computer, a fan is disposed at a specific position of the main body, and a structure of the heat sink is determined after the heat sink is manufactured. Thus, a direction of the heat dissipation airflow in the main body is fixed. Even a fan housing is added to the heat sink, only an effect of concentrating the airflow is achieved. Once components disposed in the main body is changed to make a flow field of a whole system change, the original heat dissipation airflow cannot provide effective heat dissipation to the electronic components whose positions are changed. Thus, normal operation of the main body is affected.

BRIEF SUMMARY OF THE INVENTION

The invention provides a heat dissipation module which can change a direction of heat dissipation airflow to provide optimal heat dissipation effect.

The invention further provide an electronic device using the heat dissipation module to provide an elastic and superior heat dissipation effect to maintain the normal operation of electronic components in the electronic device.

To describe the invention specifically, a heat dissipation module is provided. The heat dissipation module includes a heat sink, a wind-guiding element, and a pivot. The wind-guiding element is disposed on the heat sink. The pivot is connected between the heat sink and the wind-guiding element to allow the wind-guiding element to rotate relative to the heat sink via the pivot.

In an embodiment of the invention, the heat sink includes a base and a plurality of fins. The fins are disposed on the base and integrated with the base.

In an embodiment of the invention, the fins are perpendicular to the base and disposed parallel to each other.

In an embodiment of the invention, the pivot is disposed between two adjacent fins, and a rotating axial direction of the pivot is parallel to an extending direction of the fins Additionally, the wind-guiding element may includes a wind-guiding body and a connecting portion connected with a middle portion of the wind-guiding body. The connecting portion is disposed at the top of the fins and connected with the heat sink via the pivot. Additionally, the connecting portion may further have a guide slot, and the heat sink may include a guide pin. The guide pin is disposed in the guide slot and between the two adjacent fins to allow the guide pin to move in the guide slot when the wind-guiding element rotates relative to the heat sink.

The guide pin is disposed in the guide slot and between the two adjacent fins to allow the guide pin to move in the guide slot when the wind-guiding element rotates relative to the heat sink.

In an embodiment of the invention, the pivot passes through the fins. A rotating axial direction of the pivot is orthogonal to the extending direction of the fins.

Additionally, the wind-guiding element includes a wind-guiding body and two connecting portions connected with two opposite sides of the wind-guiding body, respectively. The two connecting portions are connected with two outermost fins via the pivot, respectively.

In an embodiment of the invention, the wind-guiding body is a curved plate. The curved plate has a concave wind-guiding surface facing the heat sink.

In an embodiment of the invention, the wind-guiding body and the connecting portion are bended from one board.

The invention further provides an electronic device using the heat dissipation module. The electronic device includes a circuit board, an electronic component, and the heat dissipation module. The electronic component is disposed on the circuit board and electrically connected with the circuit board. The heat sink on the heat dissipation module is disposed on the electronic component to radiate heat of the electronic component.

The electronic component may be a central processing unit (CPU), a memory, a graphic processing unit (GPU), a chipset or an application specific integrated circuit (ASIC).

As stated above, the invention disposes a wind-guiding element on a heat sink. A user can rotate the wind-guiding element relative to the heat sink according to demands to change the direction of the heat dissipation airflow to allow the heat dissipation airflow to smoothly pass through the heat sink to reach an optical heat dissipation effect. The heat dissipation module can provide effective heat dissipation to the electronic components of the electronic device to make the electronic component maintain normally operation and improve stability and lifetime.

These and other features, aspects and advantages of the present invention will become better understood with regard to the following description, appended claims, and accompanying drawings.

DETAILED DESCRIPTION OF THE EMBODIMENTS

A heat dissipation module according to the invention can be used in various occasions such as radiating heat of electronic components of an electronic device. The type of the electronic component includes a CPU, a memory, a GPU, a chipset, an ASIC or one of other common electronic components. A structure with which the heat dissipation module is used at the electronic device is taken as an example. Different structures of the heat dissipation modules in embodiments are shown hereafter to describe the spirit of the invention. However, a usage of the heat dissipation module of the invention is not limited to structures shown in the embodiments. According to the invention and basing on prior art, persons having ordinary skill in the art may use the heat dissipation module in other occasions according to actual situations.

Figure 1:
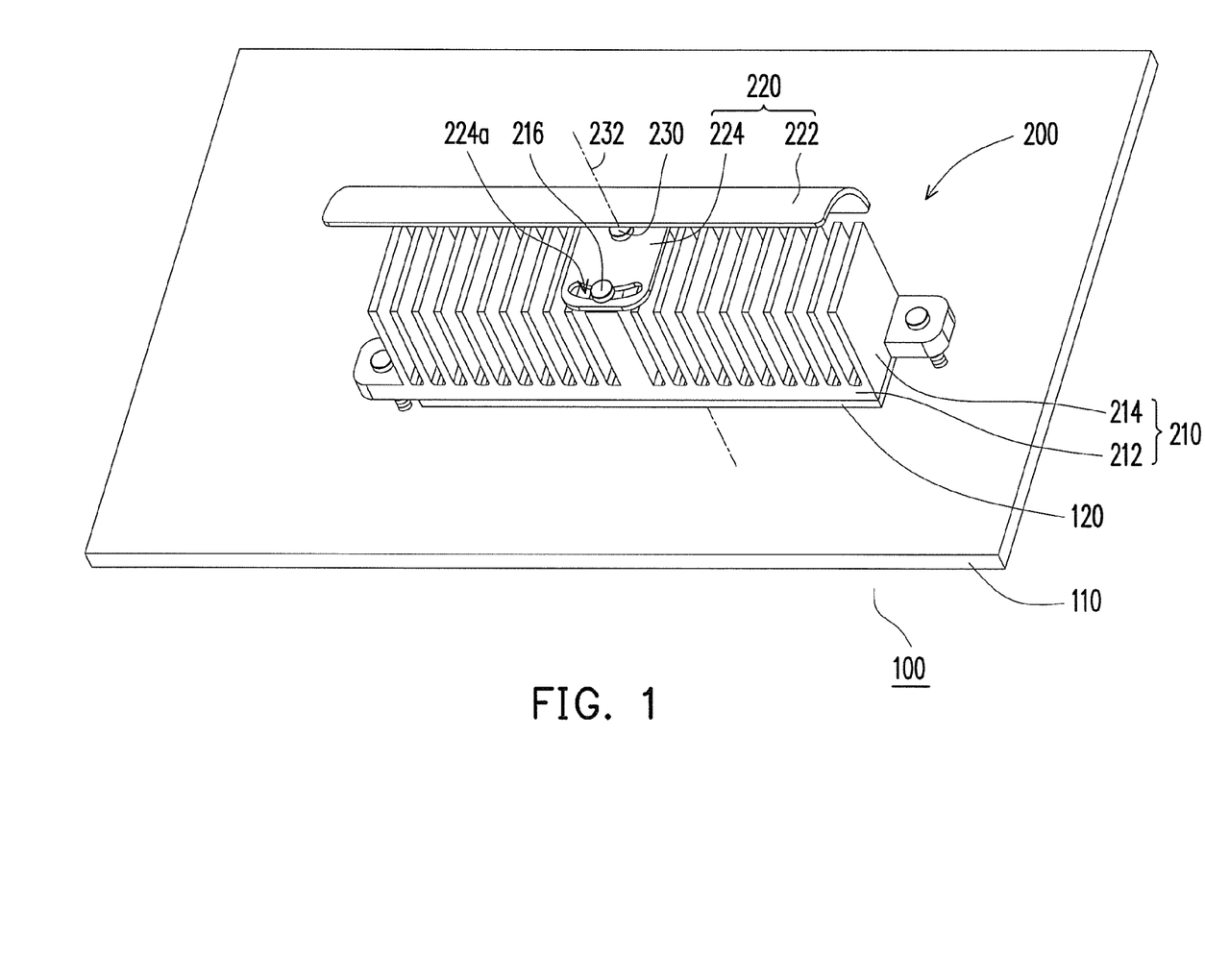
FIG. 1 is a schematic diagram showing a heat dissipation module used at an electronic device according to an embodiment of the invention.
Figure 2:
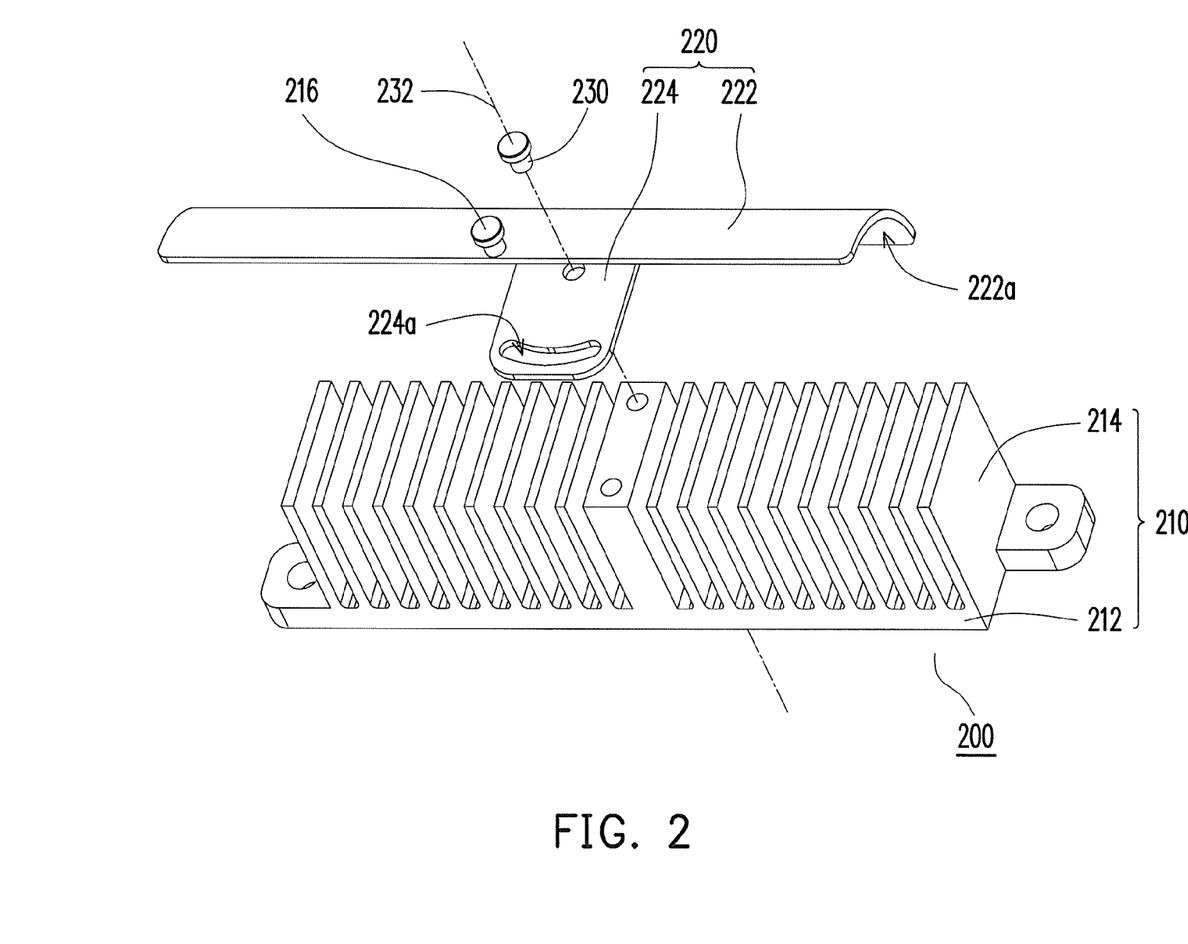
FIG. 2 is an exploded diagram showing the heat dissipation module in FIG. 1.

FIG. 1 is a schematic diagram showing a heat dissipation module used at an electronic device according to an embodiment of the invention. FIG. 2 is an exploded diagram showing the heat dissipation module in FIG. 1.

As shown in FIG. 1, at least one electronic component 120 (taken one electronic component as an example) is disposed on a circuit board 110 of an electronic device 100. The electronic component 120 may be a CPU, a memory, a GPU, a chipset, an ASIC or one of other common electronic components, and it can be electrically connected with the circuit board 110 in kinds of possible ways. Additionally, a heat dissipation module 200 is disposed on the circuit board 110 to radiate heat of the electronic component 120.

As shown in FIG. 1 and FIG. 2, the heat dissipation module 200 in this embodiment includes a heat sink 210, a wind-guiding element 220, and a pivot 230. The wind-guiding element 220 is disposed on the heat sink 210 and connected with the heat sink 210 via the pivot 230. Thus, the wind-guiding element 220 can rotate relative to the heat sink 210.

Detailedly speaking, the heat sink 210 in this embodiment includes a base 212 and fins 214 vertically and upwards extending from the base 212. The fins 214 may be disposed parallel to each other and integrated with the base 212. Additionally, the pivot 230 is disposed between two adjacent fins of the fins 214. A rotating axial direction 232 of the pivot 230 in this embodiment is parallel to an extending direction of the fins 214. In other words, the wind-guiding element 220 rotates relative to the heat sink 210 along the rotating axial direction 232.

The wind-guiding element 220 in this embodiment includes a wind-guiding body 222 and a connecting portion 224. The connecting portion 224 is connected with a middle portion of the wind-guiding body 222. The connecting portion 224 and the wind-guiding body 222 may be bended from one board. Additionally, the connecting portion 224 is disposed at the top of the fins 214 and connected with the heat sink 210 via the pivot 230. Furthermore, the wind-guiding body 222 may be a curved plate including a concave wind-guiding surface 222a facing the heat sink 210. When heat dissipation airflow reach the wind-guiding body 222, it is blocked by the wind-guiding body 222 to flow to the heat sink 210 along the wind-guiding surface 222a.

Figure 3:
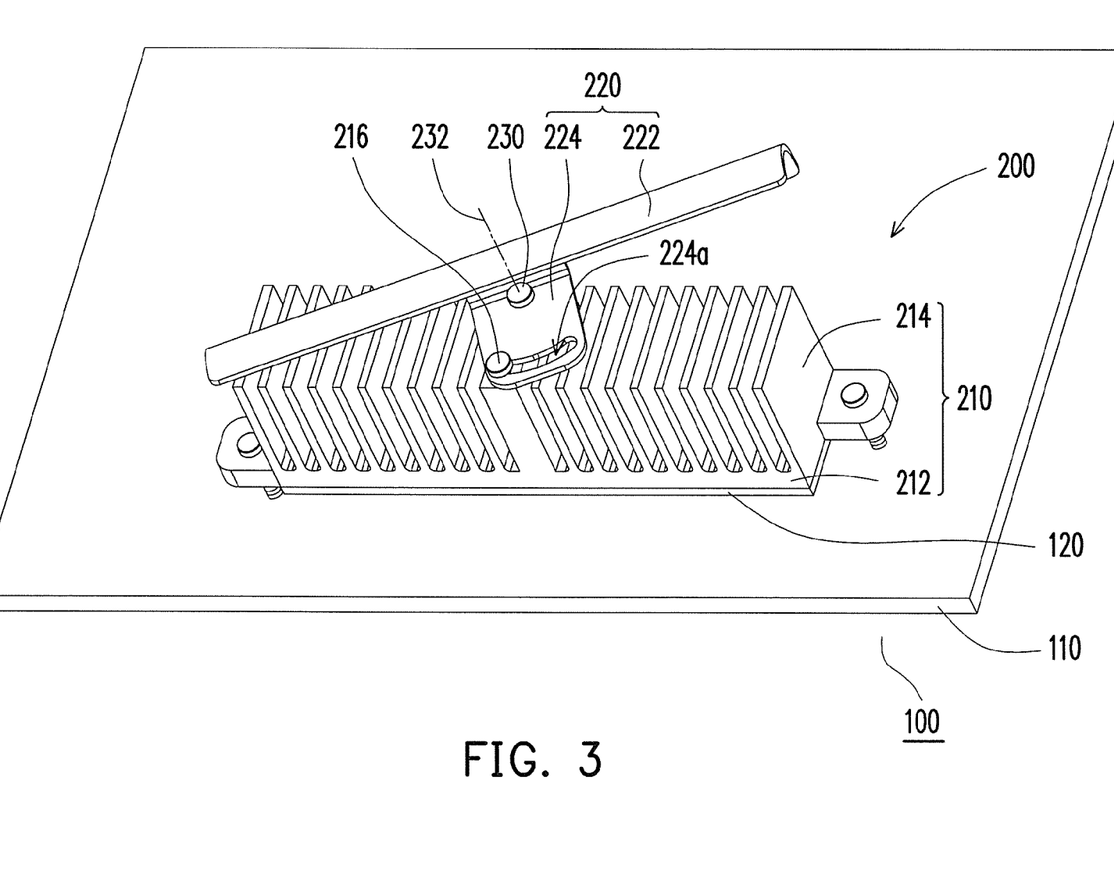
FIG. 3 is a schematic diagram showing a wind-guiding element in FIG. 1 rotating relative to a heat sink.

To make the rotation of the wind-guiding element 220 rotating relative to the heat sink 210 more reliably and control a rotating stroke of the wind-guiding element 220, in this embodiment, a guide slot 224a is further formed at the connecting portion 224 of the wind-guiding element 220. Correspondingly, a guide pin 216 is disposed between two adjacent fins of the fins 214 of the heat sink 210. The guide pin 216 is disposed in the guide slot 224a to allow the guide pin 216 to move in the guide slot 224a when the wind-guiding element 220 rotates relative to the heat sink 210 to control the rotating stroke of the wind-guiding element 220. FIG. 3 is a schematic diagram further showing a wind-guiding element 220 in FIG. 1 rotating relative to a heat sink 210. In FIG. 3, the guide pin 216 is at an end of the guide slot 224a, and the wind-guiding element 220 is at a limit position of the rotating stroke.

In the above embodiment, the wind-guiding element which can rotate along a perpendicular axial direction is disposed on the heat sink to allow the wind-guiding element to rotate relative to the heat sink according to demands to change the direction of the heat dissipation airflow to provide a better heat dissipation effect to the electronic component. Certainly, a disposition of the wind-guiding element and the heat sink according to the invention is not limited to the disposition in the above embodiment, and another embodiment is shown hereafter to explain. In the following embodiment, the same or similar components numbers denote the same or similar components. Some description of the components may be omitted if the illustration is not affected.

Figure 4:
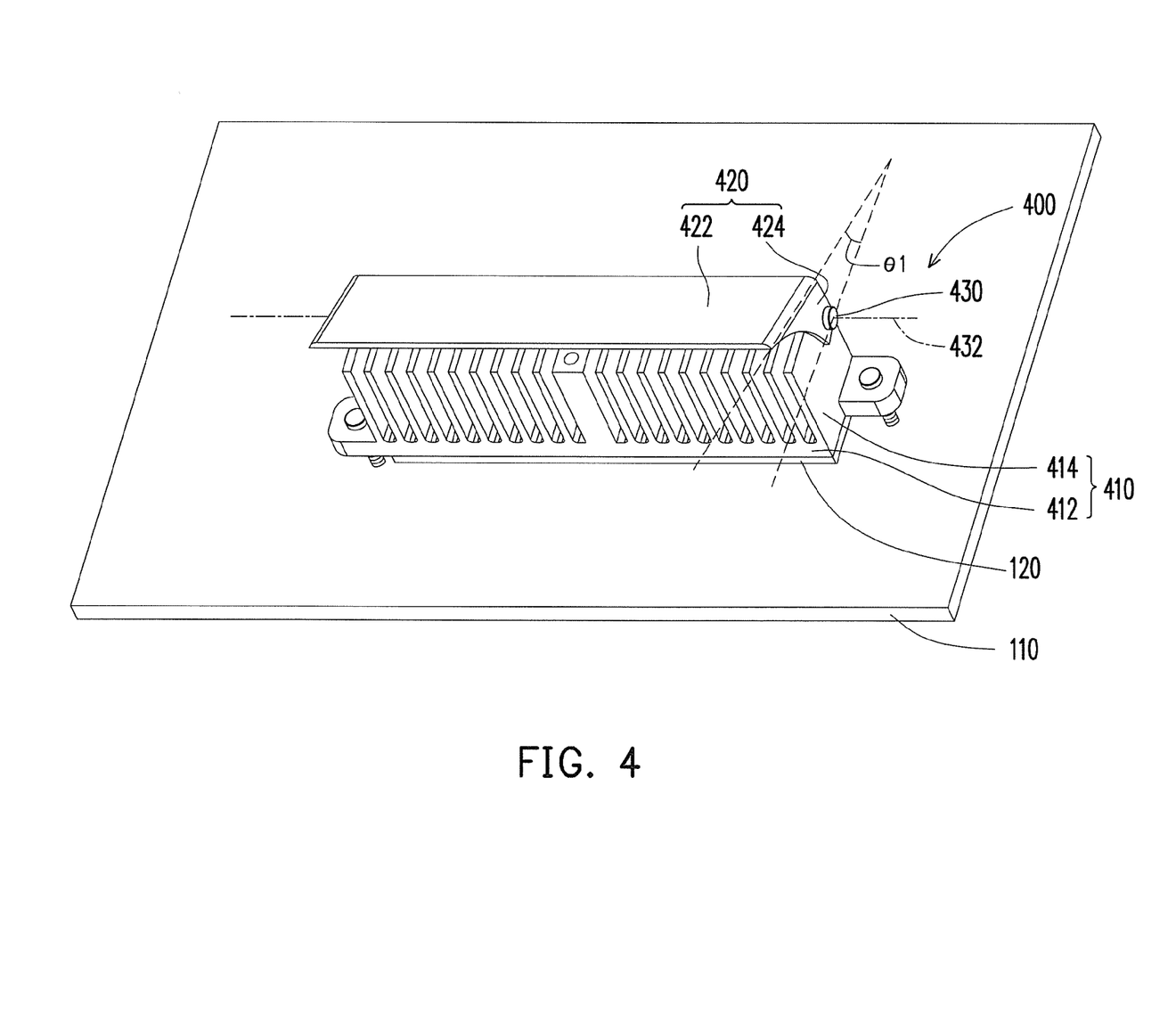
FIG. 4 is a schematic diagram showing a heat dissipation module used at an electronic device according to another embodiment of the invention.
Figure 5:
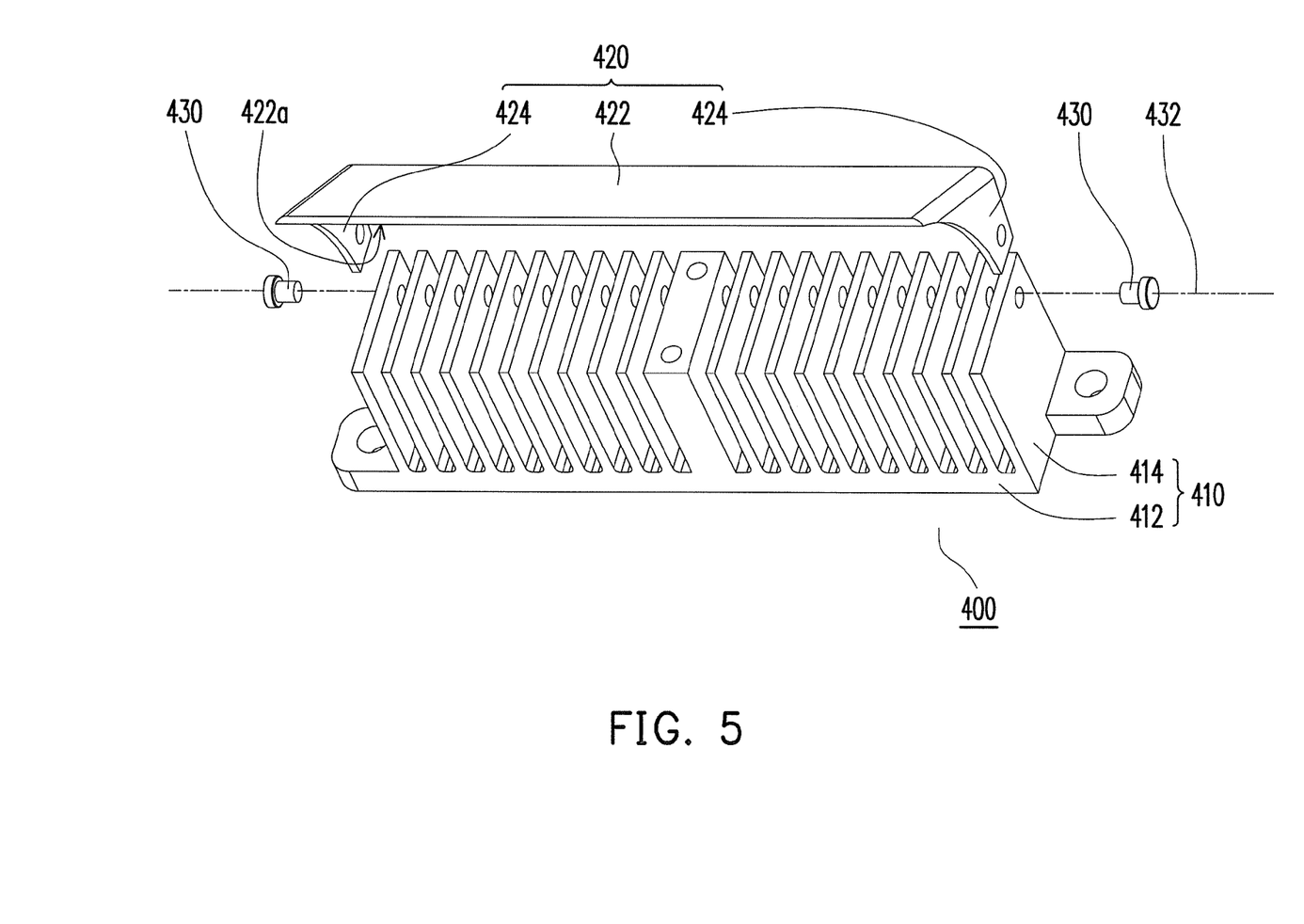
FIG. 5 is an exploded diagram showing the heat dissipation module in FIG. 4.

FIG. 4 is a schematic diagram showing a heat dissipation module used at an electronic device according to another embodiment of the invention. FIG. 5 is an exploded diagram showing the heat dissipation module in FIG. 4. As shown in FIG. 4 and FIG. 5, a heat dissipation module 400 is disposed on the circuit board 110 to radiate the heat of the electronic component 120 on the circuit board 110. The heat dissipation module 400 includes a heat sink 410, a wind-guiding element 420, and pivots 430. The wind-guiding element 420 is disposed on the heat sink 410 and connected with the heat sink 410 via the pivots 430. Thus, the wind-guiding element 420 can rotate relative to the heat sink 410. Additionally, the heat sink 410 includes a base 412 and fins 414. The fins 414 vertically and upwards extend from the base 412 and are disposed parallel to each other. The base 412 and the fins 414 may be made in an integrated mode.

In FIG. 4 and FIG. 5, unlike the former embodiment, in this embodiment, a disposition mode of the pivots 430 is changed to allow the wind-guiding element 420 to rotate relative to the heat sink 410 along another axial direction to meet variances and requirement of different flow fields. Detailedly speaking, the pivots 430 in this embodiment pass through the fins 414, and a rotating axial direction 432 of the pivots 430 is orthogonal to the extending direction of the fins 414. The wind-guiding element 420 includes a wind-guiding body 422 and two connecting portions 424. The two connecting portions 424 are connected with two opposite sides of the wind-guiding body 422, respectively. The two connecting portions 424 are connected with two outermost fins 414 via the pivots 430, respectively, to allow the wind-guiding element 420 to rotate relative to the heat sink 410 along the pivots 430. Additionally, the wind-guiding body 422 may be a curved plate. The curved plate has a concave wind-guiding surface 422a facing the heat sink 410 to lead the airflow at the wind-guiding body 422 to make the airflow flow to the heat sink 410 along the wind-guiding surface 422a.

Figure 6:
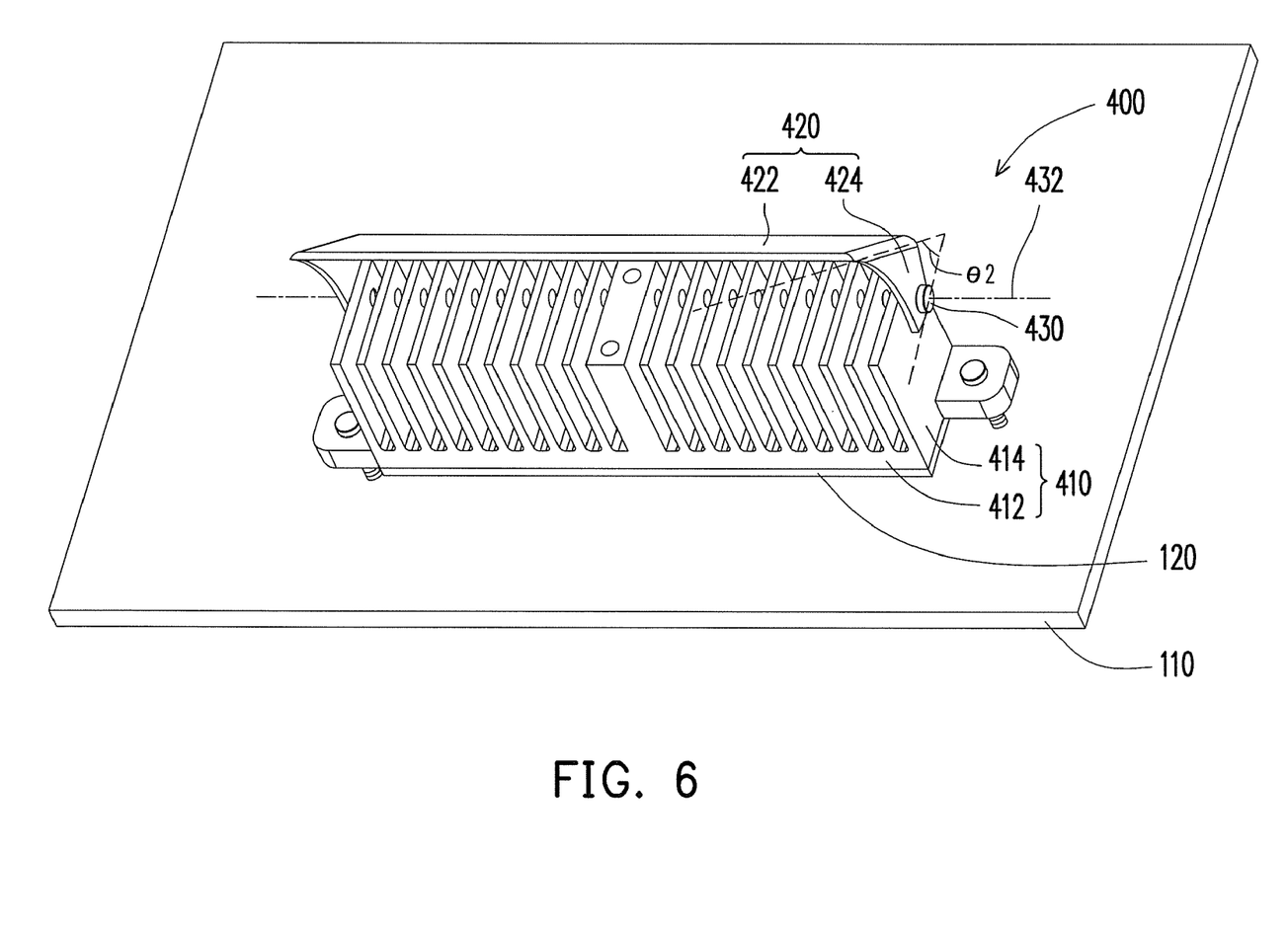
FIG. 6 is a schematic diagram showing a wind-guiding element in FIG. 4 rotating relative to a heat sink.

FIG. 6 is a schematic diagram further showing a wind-guiding element 420 in FIG. 4 rotating relative to a heat sink 410. A tilt angle of the wind-guiding element 420 may be adjusted via the pivots 430 to allow an elevation of the wind-guiding element 420 to be changed from θ1 as shown in FIG. 4 to θ2 as shown in FIG. 6 relative to a plane.

As stated above, the heat dissipation module according to the invention may be used at an electronic device to radiate heat of an electronic component of the electronic device. Since the wind-guiding element on the heat dissipation module may rotate relative to the heat sink, the direction of the heat dissipation airflow can be adjusted according to demands to reach an optical heat dissipation effect. The heat dissipation module can provide effective heat dissipation to the electronic components of the electronic device to make the electronic component maintain normal operation and improve stability and lifetime of a whole system.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat dissipation module, comprising:
   a heat sink, comprising a base and a plurality of fins, wherein the fins are disposed on the base and integrated with the base;
   a wind-guiding element disposed on the heat sink; and
   a pivot connected between the heat sink and the wind-guiding element to allow the wind-guiding element to rotate relative to the heat sink via the pivot,
   wherein the wind-guiding element comprises a wind-guiding body and a connecting portion connected with a middle portion of the wind-guiding body, and the connecting portion is disposed at the top of the fins and connected with the heat sink via the pivot,
   wherein the connecting portion further comprises a guide slot, the heat sink further comprises a guide pin disposed in the guide slot and between two adjacent fins, and when the wind-guiding element rotates relative to the heat sink, the guide pin moves in the guide slot.

2. The heat dissipation module according to claim 1, wherein the fins are perpendicular to the base and disposed parallel to each other.

3. The heat dissipation module according to claim 2, wherein the pivot is disposed between the two adjacent fins, and a rotating axial direction of the pivot is parallel to an extending direction of the fins.

4. The heat dissipation module according to claim 1, wherein the wind-guiding body is a curved plate, and the curved plate has a concave wind-guiding surface facing the heat sink.

5. The heat dissipation module according to claim 1, wherein the wind-guiding body and the connecting portion are bended from one board.

6. An electronic device, comprising:
   a circuit board;
   an electronic component disposed on the circuit board and electrically connected with the circuit board; and
   a heat dissipation module, comprising:
      a heat sink disposed on the electronic component, wherein the heat sink comprises a base and a plurality of fins, the base is combined with the circuit board, the fins are disposed on the base and integrated with the base, and the fins are perpendicular to the base and disposed parallel to each other;
      a wind-guiding element disposed on the heat sink; and
      a pivot connected between the heat sink and the wind-guiding element to allow a wind deflector to rotate relative to the heat sink via the pivot.

7. The electronic device according to claim 6, wherein the pivot is disposed between two adjacent fins, and a rotating axial direction of the pivot is parallel to an extending direction of the fins.

8. The electronic device according to claim 7, wherein the wind-guiding element comprises a wind-guiding body and a connecting portion connected with a middle portion of the wind-guiding body, and the connecting portion is disposed at the top of the fins and connected with the heat sink via the pivot.

9. The electronic device according to claim 8, wherein the connecting portion further comprises a guide slot, the heat sink further comprises a guide pin disposed in the guide slot and between two adjacent fins, and when the wind-guiding element rotates relative to the heat sink, the guide pin moves in the guide slot.

10. The electronic device according to claim 8, wherein the wind-guiding body is a curved plate, and the curved plate has a concave wind-guiding surface facing the heat sink.

11. The electronic device according to claim 8, wherein the wind-guiding body and the connecting portion are bended from one board.

12. The electronic device according to claim 6, wherein the pivot passes through the fins, and a rotating axial direction of the pivot is orthogonal to the extending direction of the fins.

13. The electronic device according to claim 12, wherein the wind-guiding element comprises a wind-guiding body and two connecting portions connected with two opposite sides of the wind-guiding body, respectively, and the two connecting portions are connected with two outermost fins via the pivot, respectively.

14. The electronic device according to claim 13, wherein the wind-guiding body is a curved plate, and the curved plate has a concave wind-guiding surface facing the heat sink.

15. The electronic device according to claim 13, wherein the wind-guiding body and the connecting portion are bended from one board.

16. The electronic device according to claim 6, wherein the electronic component comprises a central processing unit (CPU), a memory, a graphic processing unit (GPU), a chipset or an application specific integrated circuit (ASIC).

* * * * *

UNITED STATES PATENT AND TRADEMARK OFFICE
CERTIFICATE OF CORRECTION

PATENT NO. : 8,254,127 B2
APPLICATION NO. : 12/646974
DATED : August 28, 2012
INVENTOR(S) : Chiu et al.

It is certified that error appears in the above-identified patent and that said Letters Patent is hereby corrected as shown below:

On the cover page of the patent grant, the item (73) Assignee's Name "ASUSTek COMPUTER INC." should be changed to -- ASUSTeK COMPUTER INC. --.

Signed and Sealed this
Sixth Day of November, 2012

David J. Kappos
*Director of the United States Patent and Trademark Office*